US007176602B2

(12) United States Patent
Schlenke

(10) Patent No.: US 7,176,602 B2
(45) Date of Patent: Feb. 13, 2007

(54) METHOD AND DEVICE FOR ENSURING TRANDSDUCER BOND LINE THICKNESS

(75) Inventor: David T. Schlenke, Janesville, WI (US)

(73) Assignee: SSI Technologies, Inc., Janesville, WI (US)

( * ) Notice: Subject to any disclaimer, the term of this patent is extended or adjusted under 35 U.S.C. 154(b) by 172 days.

(21) Appl. No.: 10/967,381

(22) Filed: Oct. 18, 2004

(65) Prior Publication Data

US 2006/0082259 A1 Apr. 20, 2006

(51) Int. Cl.
*H01L 41/053* (2006.01)

(52) U.S. Cl. ....................................... 310/348; 310/311

(58) Field of Classification Search ................ 310/322, 310/326, 334, 327, 348, 311

See application file for complete search history.

(56) References Cited

U.S. PATENT DOCUMENTS 3,059,130 A 10/1962 Robins
3,619,672 A * 11/1971 Nagata et al. .............. 310/344
3,669,789 A 6/1972 Utsugi et al.
3,685,110 A 8/1972 Randolph, Jr.
4,156,158 A 5/1979 Wilson et al.
4,310,957 A 1/1982 Sachs
4,398,325 A 8/1983 Piaget et al.
4,551,647 A 11/1985 Day
4,564,980 A 1/1986 Diepers
4,747,192 A 5/1988 Rokurota
5,311,095 A 5/1994 Smith et al.
5,371,428 A * 12/1994 Kikuchi et al. ............. 310/324
5,684,884 A 11/1997 Nakaya et al.
5,764,596 A 6/1998 Hanafy et al.
5,844,349 A 12/1998 Oakley et al.
6,429,574 B1 8/2002 Mohr, III et al.
6,437,487 B1 8/2002 Mohr, III et al.
6,448,697 B1 * 9/2002 Vaughn ...................... 310/348
6,467,138 B1 * 10/2002 Aime ........................ 29/25.35
6,472,610 B1 * 10/2002 Kawabata ................... 174/260
6,483,225 B1 11/2002 Spigelmyer
6,700,304 B1 * 3/2004 Fuller et al. ................ 310/321
6,731,050 B2 5/2004 Bindig et al.
6,984,925 B2 * 1/2006 Morley et al. .............. 310/348
2002/0135273 A1 9/2002 Mauchamp et al.

FOREIGN PATENT DOCUMENTS

JP 2003-110396 * 4/2003

* cited by examiner

*Primary Examiner*—Thomas M. Dougherty
(74) *Attorney, Agent, or Firm*—Michael Best & Friedrich LLP

(57) ABSTRACT

An apparatus and method for producing a substantially uniform bond line thickness by utilizing a crosshatch, grid pattern, or spacers of like patterns in a receptacle of a transducer housing. Certain embodiments include a housing configured to retain a transducer. The housing includes an annular wall and a receptacle adjacent to the wall. The receptacle has a member configured to allow radiation to pass through it. The member has a first surface and a second surface. The spacers on the first surface are configured in a grid pattern to maintain uniform spacing and a uniform bond line thickness between the transducer and the member. The bond line is further controlled by the depth of the spacers, which are configured to maintain a generally constant bond line thickness.

19 Claims, 5 Drawing Sheets

METHOD AND DEVICE FOR ENSURING TRANDSDUCER BOND LINE THICKNESS

FIELD OF THE INVENTION

Embodiments of the invention relate to controlling bond line thickness in a transducer housing. More specifically, embodiments relate to a transducer housing configured to provide a uniform bond line thickness between the transducer and the housing.

BACKGROUND OF THE INVENTION

A transducer is a device that converts energy from one form (e.g., electrical) to another (e.g., mechanical). Transducers are used in a variety of automotive, commercial, and industrial applications. Ceramic crystals are used as transducers in ultrasonic devices. The crystals convert an electrical input into sound waves. Ultrasonic devices may be used in medical imaging, non-destructive testing, and distance and level sensing applications among others.

SUMMARY OF THE INVENTION

Although a variety of devices that use transducers exist, there are some problems with transducers used in ultrasonic devices. In particular, it was found that the manner in which the transducer ceramic piezoelectric crystals are mounted and fixed in a housing can adversely effect the operation of the device or transducer.

In many ultrasonic devices, adhesive is typically used to bond the transducer to the housing. The methods used to apply the adhesive as well as the adhesive used may vary. This can cause relatively large variations in device performance. Excessive adhesive or bond thickness can adversely affect the characteristics of a transducer. In some applications, the optimum thickness of the adhesive is 0.002"–0.005". The optimum thickness is based on the specific transducer-to-housing interface. The interface bond and its thickness is a combination of housing and transducer frequency requirements. When what is called the "bond line thickness" of the adhesive is not uniform, sensitivity of the device is significantly degraded. In addition, a non-uniform bond line can impact the radiation of sound waves from the device. This, in turn, can cause non-uniform penetration or reflection of the sound waves in or from a target of interest.

Accordingly, in one embodiment, the invention provides an apparatus and method for producing uniform bond line thickness by utilizing a spacer or a grid pattern in the receptacle of the transducer housing. The bond line thickness is controlled by the height of the spacer or grid pattern. The transducer can be pressed tight to the top of the spacer with an adhesive providing a bond between the transducer and the housing member.

Another embodiment provides a housing configured to retain a transducer. The housing includes a wall and a receptacle positioned adjacent to the wall. The receptacle has a member configured to allow ultrasonic energy to pass through. The member has a first surface and a second surface, whereby the first surface includes at least three spacers defining a uniform planar surface. The spacers are configured to maintain a substantially uniform bond line thickness between the transducer and the member. In further embodiments of this invention, the spacers can be configured in a variety of shapes and may take the form of pyramids, columns, domes, etc. The spacers are configured to be of substantially equal height in order to maintain a uniform bond line thickness.

In a yet another embodiment, the wall is annular and the spacers are configured in a crosshatch, or grid pattern, on the first surface. The grid pattern is configured to maintain uniform spacing between the transducer and the member. The bond line is further controlled by the depth of the spacers, which are configured to maintain a substantially constant bond line. The constant bond line thickness is maintained regardless of the type of adhesive used between the transducer and the member and regardless of the method used to deposit the adhesive between the transducer and the member.

Another embodiment provides a method of providing a uniform bond line in a housing for a transducer. The method includes providing a spacer on a first surface of the housing. A height of the spacer is pre-selected and then a predetermined amount of adhesive is deposited on the housing and the spacer such that passage of ultrasonic energy through the housing is not adversely affected. Further, the spacer is configured to maintain a substantially uniform bond line and spacing between the transducer and the member.

Another embodiment provides a housing configured to retain a transducer and a generally circular component. The housing includes a wall and a receptacle adjacent to the wall. The receptacle has a member configured to allow ultrasonic energy to pass through. The member has a first surface and a second surface. The first surface is planar and configured to receive a generally circular component. The component has a first surface and a second surface. The second surface of the component is bonded with adhesive to the first surface of the member. The first surface of the component includes spacers. The spacers are configured to maintain uniform spacing between the transducer and the component. In a further embodiment of the invention, the spacers are configured in a crosshatch, or a grid pattern, on the first surface of the member.

Additional aspects and features of embodiments will become apparent by reference to the detailed description of the invention taken in combination with the accompanying drawings.

DETAILED DESCRIPTION

Figure 1:
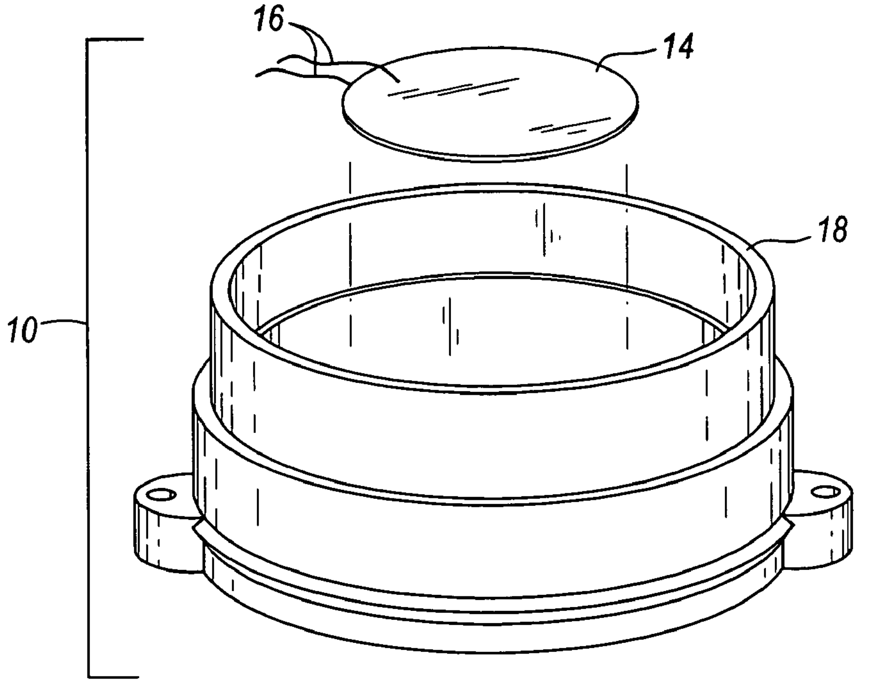
FIG. 1 is a perspective view of an exemplary transducer housing.

FIG. 1 shows a housing 10 that is configured to retain a transducer 14, which includes electrical leads 16. The transducer is preferably formed of ceramic piezoelectric crystals.

The housing 10 includes a wall 18 and a receptacle 22. The housing 10 provides protection against environmental contaminants, and may incorporate or include signal conditioning circuits and mechanical and electrical interfaces (not shown). For example, the housing could include a socket or connector to provide a connection to a processing circuit. In the embodiment shown, the wall 18 is annular. The receptacle 22 is positioned adjacent to the wall 18.

Figure 2:
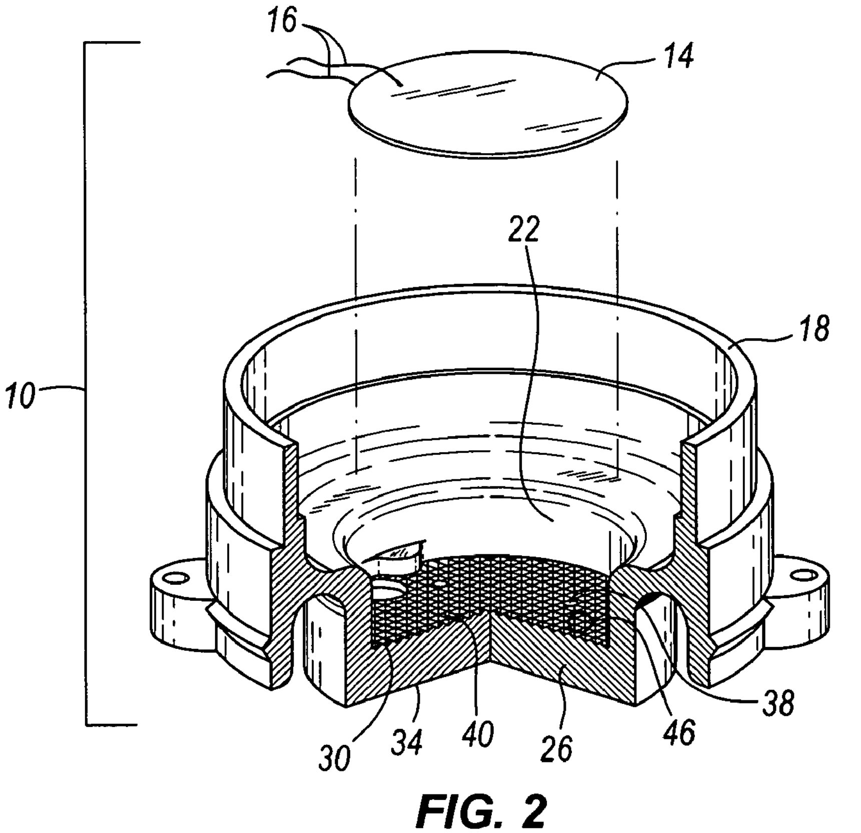
FIG. 2 is a sectional view of the transducer housing shown in FIG. 1.

As best seen by reference to FIG. 2, the receptacle 22 has a member 26 configured to pass energy through, such as ultrasonic waves or ultrasonic energy. The member 26 has a first surface 30, a second surface 34, and spacers, or posts, 38. The spacers 38 are configured to maintain a uniform bond line 42 (see FIG. 4*a*) between the transducer 14 and the member 26. The member 26 has a first surface 30 configured in a grid pattern 46 with at least three spacers 38, whereby each spacer 38 is positioned in a grid opening, or area, 40. The spacers 38 define a uniform plane that forms a constant bond line 42, thereby the bond line 42 is controlled by the height of the spacer 38. The spacers 38 help ensure a substantially constant-thickness bond line 42.

The spacers 38 are configured to maintain uniform spacing between the transducer 14 and the member 26, especially when adhesive 50 is applied as a bonding agent. The grid pattern 46 holds the adhesive and provides additional surface area for the adhesive to bond to help ensure a substantially constant-thickness bond line 42. The type of adhesive used for creating the bond line will vary and is dependent on the specific housing material chosen, although Loctite E120 adhesive has proven to be useful for bonding ceramic ultrasonic transducers to a polyethylene housing. Additionally, the process used to apply the adhesive 50 to the member 26 can vary. However, mechanical dispensing units have proven to increase the accuracy of dispensing.

Figure 3:
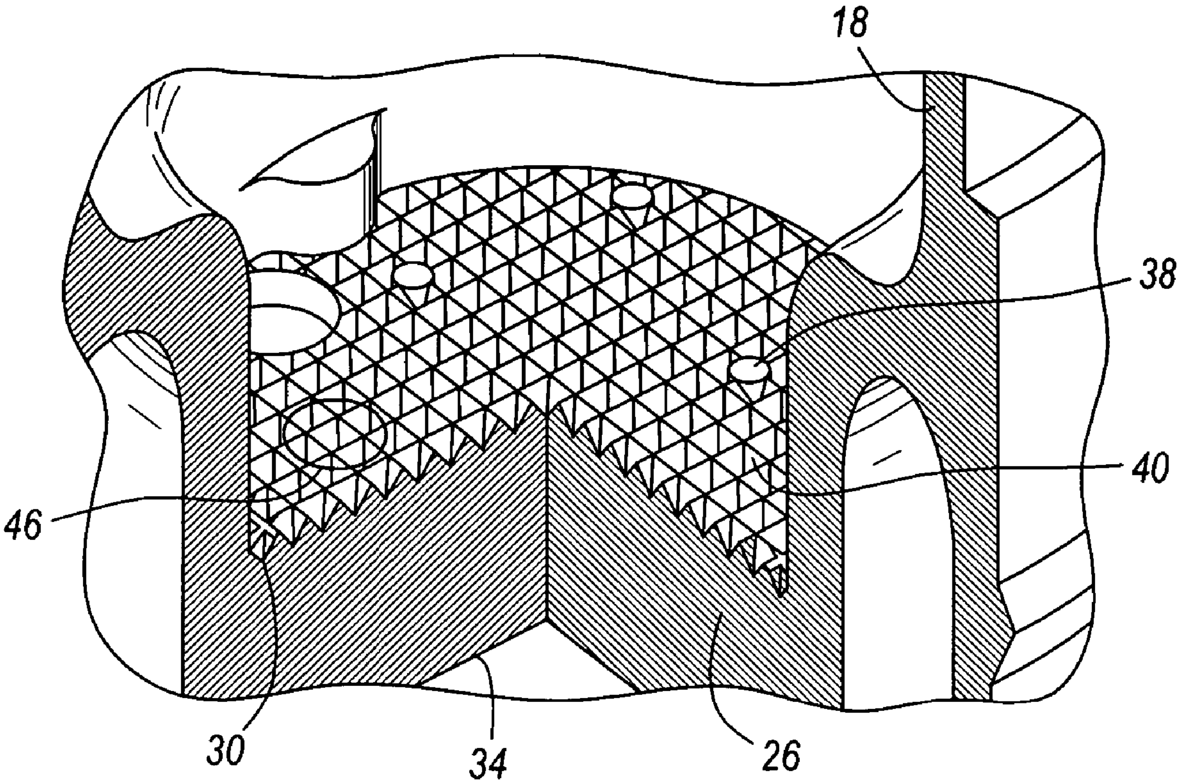
FIG. 3 is an enlarged, partial view of the transducer housing shown in FIG. 2.

As best seen by reference to FIG. 3, the grid pattern 46 on the first surface 30 may include pyramidal, columnar, or circular shaped spacers (see FIGS. 4*a*, 4*c*, 4*d*, and 4*e*). The adhesive 50 can be applied through a variety manufacturing processes to the grid pattern 46. Due to the configuration of the spacers 38, the bond line 42 between the transducer 14 and the member 26 is generally uniform, especially because the height of the spacer 38 is substantially uniform. Accordingly, the minimum and maximum depth of the adhesive 50 is generally uniform in all areas between the transducer 14 and the member 26.

Figure 4A:
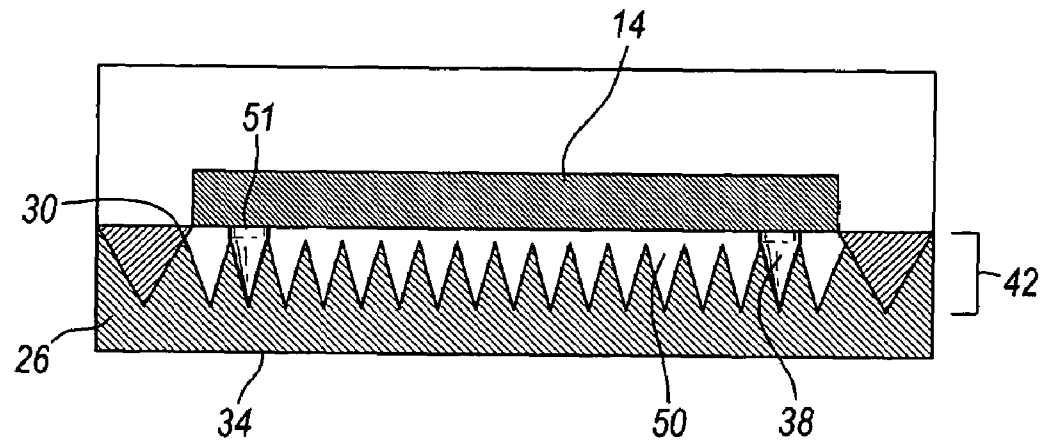
FIG. 4*a* is a cross-sectional view of the transducer housing shown in FIG. 2.

A cross-section of the embodiment of the invention shown in FIG. 3 is shown in FIG. 4*a*. The thickness of the bond line 42 is controlled by the height of the spacers 38. The spacers in FIG. 4*a* are conical in shape, wherein the widest, base portion of each spacer 38 defines a first surface 51 upon which the transducer 14 is bonded. The transducer 14 can be pressed tight to the first surface 51 of the spacers 38. The adhesive 50 provides the bond between the transducer 14 and the member 26 in areas 52 where the transducer 14 and the member 26 are not in positive contact.

Figure 4B:
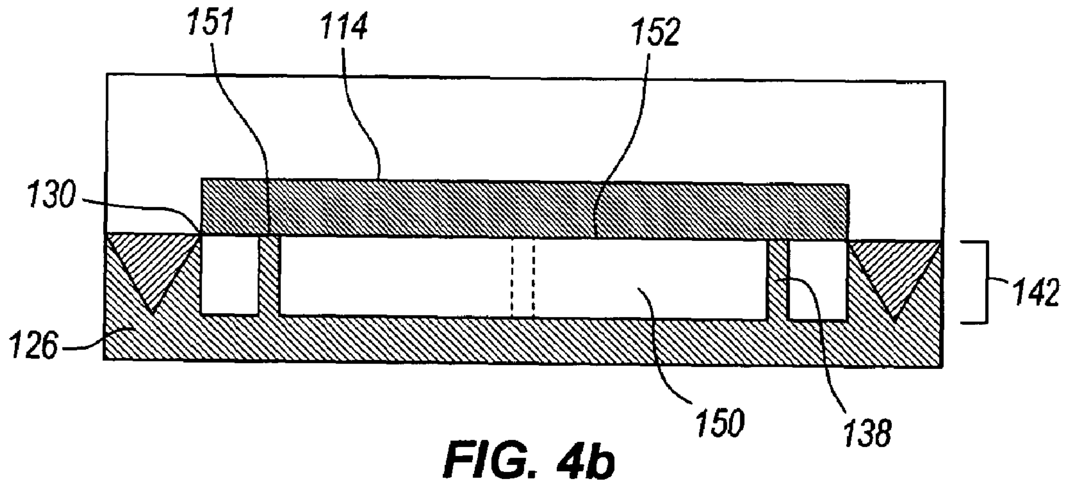
FIG. 4*b* is a cross-sectional view of a transducer housing of another embodiment of the present invention.

FIG. 4*b* is a cross-section view of another embodiment of the present invention. In this embodiment, a first surface 130 of a member 126 includes three spacers 138, which are configured to maintain a uniform bond line 142 between a transducer 114 and the member 126. The spacers 38 define a uniform planar surface that forms a constant bond line 142 and the bond line 142 is controlled by the height of the spacer 138. The spacers 138 help ensure a substantially constant-thickness bond line 142. Although the spacers 138 shown in FIG. 4*b* are columnar, in other embodiments the spacers have other shapes, such as pyramidal, rectangular or dome-like. The spacers 138 are configured to maintain uniform spacing between the transducer 114 and the member 126, especially when adhesive 150 is applied as a bonding agent. Each spacer 138 defines a first surface 151 upon which the transducer 114 is bonded. The transducer 114 is pressed tight to the first surface 151 of the spacers 138. The adhesive 150 provides the bond between the transducer 114 and the member 126 in areas 152 where the transducer 114 and the member 126 are not in positive contact.

Figure 4C:
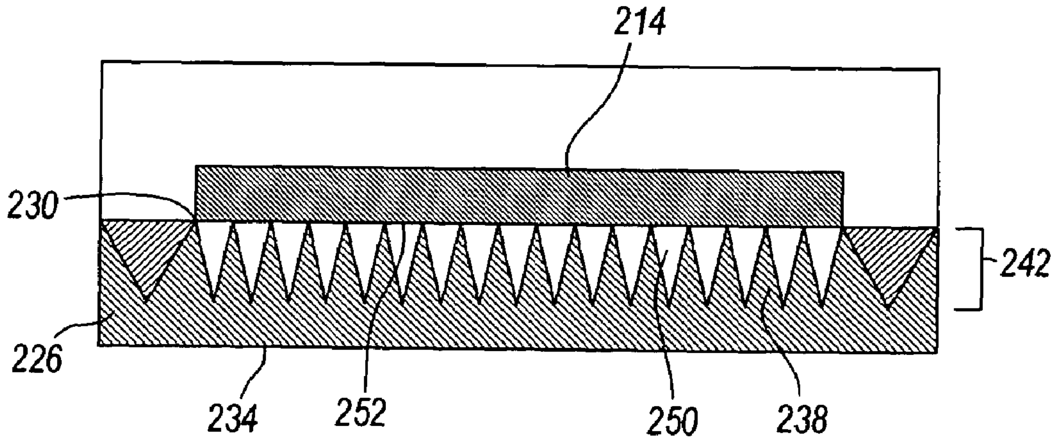
FIG. 4*c* is a cross-sectional view of a transducer housing of another embodiment of the present invention.
Figure 4D:
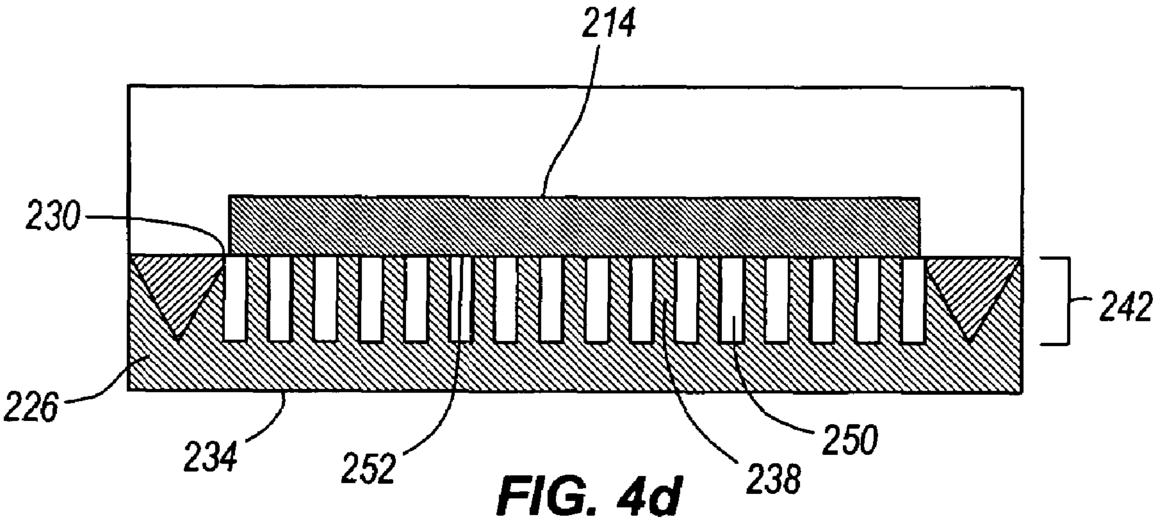
FIG. 4*d* is a cross-sectional view of a transducer housing of another embodiment of the present invention.
Figure 4E:
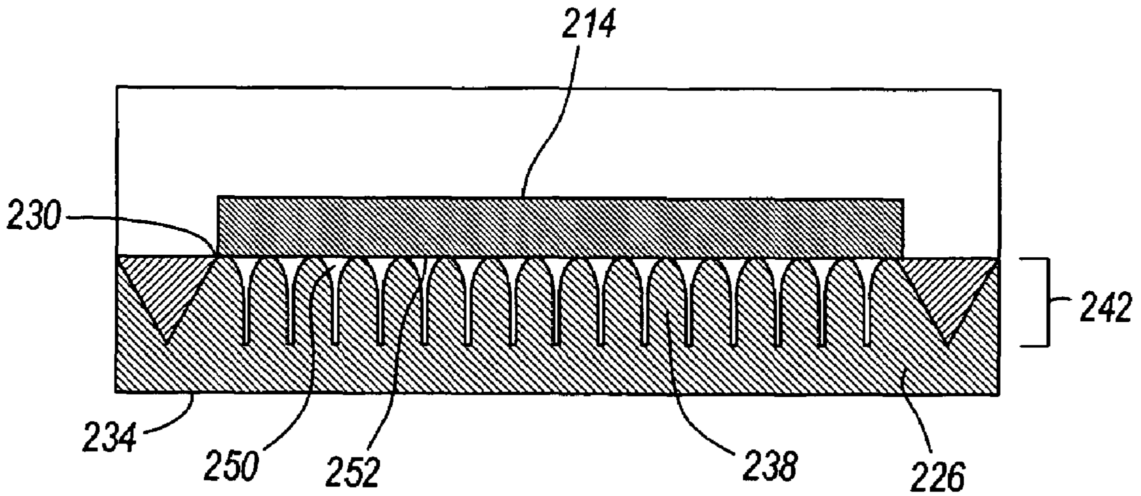
FIG. 4*e* is a cross-sectional view of a transducer housing of another embodiment of the present invention.

In further embodiments of the present invention, as shown in FIGS. 4*c*, 4*d*, and 4*e*, a member 226 has a first surface 230, a second surface 234, and a spacer 238 formed by the first surface 230. The spacer 238 is configured in a grid pattern 246 and is configured to maintain a uniform bond line 42 between a transducer 214 and the member 226. The depth of the spacer 238 controls the thickness of the bond line 242. The grid pattern 246 is configured to maintain uniform spacing between the transducer 214 and the member 226, especially when adhesive 250 is applied as a bonding agent. The grid pattern 246 helps ensure a substantially constant-thickness bond line 242.

Cross-section views of this embodiment of the invention are shown in FIGS. 4*c*, 4*d*, and 4*e*. The spacer 238 can be configured in a variety of shapes and may take the form of pyramids (see FIG. 4*c*), columns (see FIG. 4*d*), domes (see FIG. 4*e*), etc. The transducer 214 can be pressed tight to the first surface 230 of the grid pattern 246. The adhesive 250 provides the bond between the transducer 214 and the member 226 in areas 252 where the transducer 214 and the member 226 are not in positive contact. The adhesive 250 can be applied through a variety manufacturing processes to the grid pattern 246. Due to the configuration of the grid pattern 246, the bond line 242 between the transducer 214 and the member 226 is generally uniform, especially because the depth of the spacer 238 is substantially uniform. Accordingly, the minimum and maximum depth of the adhesive 250 is generally uniform throughout its length between the transducer 214 and the member 226.

Figure 5:
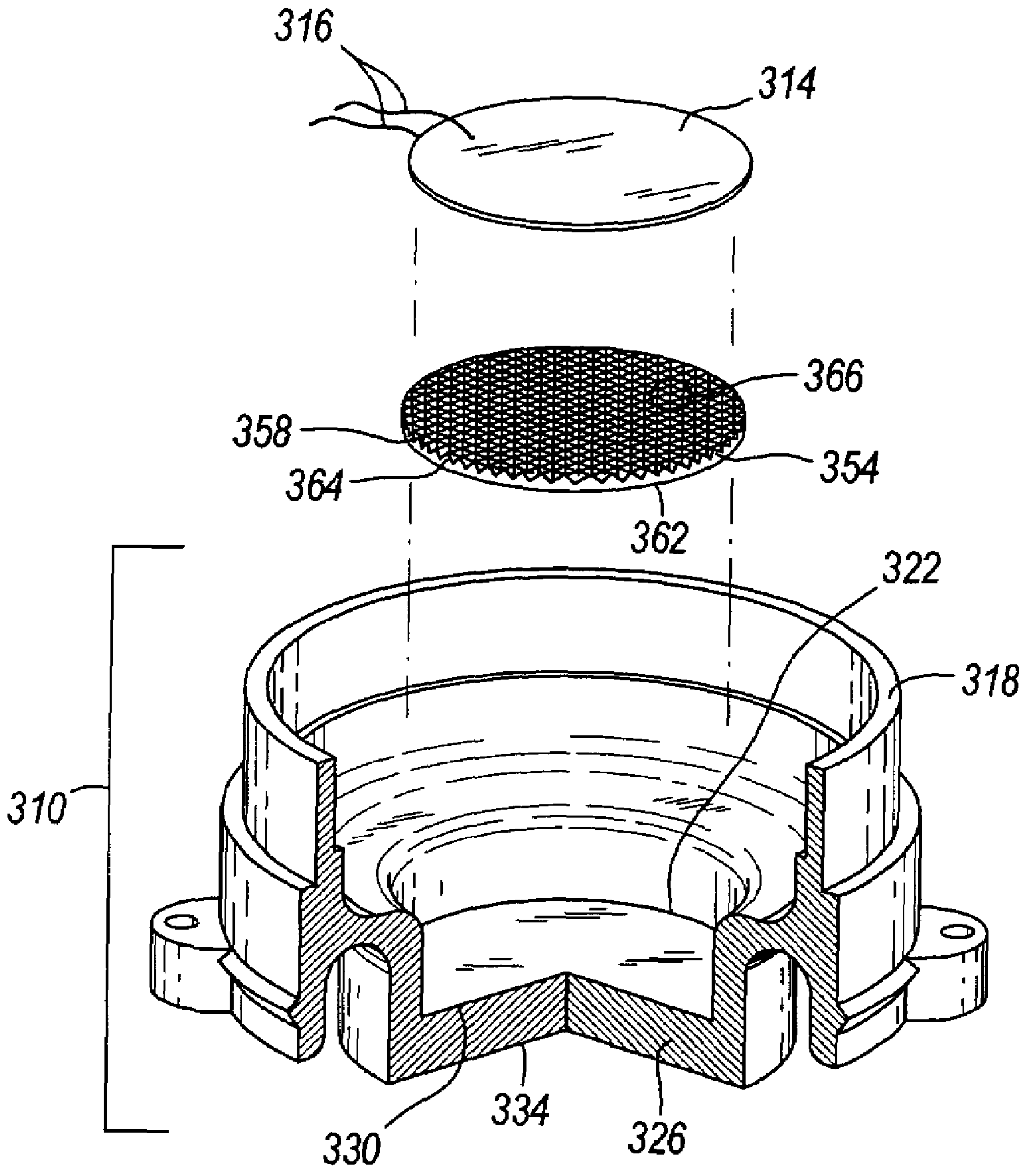
FIG. 5 is a partial, cutaway and cross-sectional view of a transducer housing illustrating a generally circular component with a crosshatch pattern.

FIG. 5 shows another embodiment where a housing 310 is configured to retain a generally circular component 354 and a transducer 314. A receptacle 322 has a member 326 configured to pass radiation therethrough. The member 326 has a first surface 330 and a second surface 334. The first surface 330 is planar and configured to receive the generally circular component 354. The component 354 has a first surface 358 and a second surface 362. The second surface 362 of the component 354 is bonded with adhesive 350 to the first surface 330 of the member 326. The first surface 358 is configured with a spacer 364 in a grid pattern 366. The spacer 364 can be a variety of shapes and may take the form of pyramids, columns, domes, etc. The spacer 364 is configured in a grid pattern 366 of substantially equal height in order to maintain a substantially uniform spacing between the transducer 314 and the component 354, especially when the adhesive 350 is applied as a bonding agent.

The embodiments described above and illustrated in the figures are presented by way of example only and are not intended as a limitation upon the concepts and principles of the invention. As such, it will be appreciated by one having ordinary skill in the art that various changes in the elements and their configuration and arrangement are possible without departing from the spirit and scope of the invention. Although the invention has been described by reference to the drawings and examples contained herein, it is not limited thereby and encompasses everything within the scope of the following claims.

We claim:

1. A housing configured to retain a transducer, the housing comprising:

a wall; and a receptacle positioned adjacent to the wall, the receptacle having a member configured to pass ultrasonic energy therethrough, the member including at least three spacers defining a uniform planar surface, the spacers configured to maintain a substantially uniform bond line between the transducer and the member.

2. The housing of claim 1, wherein the wall portion is annular.

3. The housing of claim 1 wherein each spacer is columnar.

4. The housing of claim 1 wherein each spacer is pyramidal.

5. The housing of claim 1 wherein each spacer is dome-like.

6. The housing of claim 1 wherein a thickness of the bond line is controlled by a height of the spacers.

7. The housing of claim 1 wherein the bond line has a substantially constant thickness.

8. The housing of claim 1 wherein the member includes a grid formed an a top surface of the member, the grid including grid openings, and further wherein each spacer is positioned in one of the grid openings.

9. A housing configured to retain a transducer, the housing comprising:

a wall; and a receptacle positioned adjacent to the wall, the receptacle having a member configured to pass ultrasonic energy therethrough, the member including a grid configured to maintain a substantially uniform bond line between the transducer and the member.

10. The housing of claim 9 wherein the grid is configured to maintain a substantially uniform spacing between the transducer and the member.

11. The housing of claim 9 wherein a thickness of the bond line is continued by a depth of the grid.

12. A method of providing a uniform bond line in a housing for a transducer, the method comprising:

providing a spacer on a first surface of the housing wherein a first surface of the spacer defines a uniform planar surface;

pre-selecting a height of the spacer; and disposing a predetermined amount of adhesive on the housing and the spacer wherein passage of ultrasonic energy through the housing is not adversely affected and further wherein the spacer is configured to maintain a substantially uniform bond line and spacing between a transducer and the first surface of the housing.

13. The method of claim 12 wherein a thickness of the bond line is controlled by the height of the spacer.

14. The method of claim 12 wherein the bond line has a substantially constant thickness.

15. The method of claim 12 wherein the spacer includes at least three columnar shaped protrusions.

16. The method of claim 12 wherein the spacer includes at least three pyramidal shaped protrusions.

17. The method of claim 12 wherein the spacer includes at least three dome-like protrusions.

18. The method of claim 12 wherein the spacer includes a grid defining grid openings for receiving the adhesive.

19. The method of claim 12 and further comprising forming a grid on the first surface of the housing, the grid including grid openings wherein the spacer is positioned in the grid openings.

* * * * *